United States Patent [19]

Allman et al.

[11] Patent Number: 5,340,752

[45] Date of Patent: Aug. 23, 1994

[54] METHOD FOR FORMING A BIPOLAR TRANSISTOR USING DOPED SOG

[75] Inventors: Derryl D. J. Allman, Colorado Springs, Colo.; Dim-Lee Kwong, Austin, Tex.

[73] Assignee: NCR Corporation, Dayton, Ohio

[21] Appl. No.: 965,823

[22] Filed: Oct. 23, 1992

[51] Int. Cl.⁵ .................................... H01L 21/265
[52] U.S. Cl. ................................ 437/31; 437/151; 437/152; 437/174; 437/231; 437/228
[58] Field of Search ............... 437/231, 151, 152, 174, 437/228; 148/DIG. 151, DIG.152, DIG. 3, DIG. 137, DIG. 50, DIG. 51

[56] References Cited

U.S. PATENT DOCUMENTS

| | | | |
|---|---|---|---|
| 3,507,715 | 12/1966 | Kaiser | 437/151 |
| 3,928,225 | 12/1975 | Schäfer | 252/182 |
| 4,355,454 | 10/1982 | Tasch, Jr. et al. | 29/571 |
| 4,433,008 | 2/1984 | Schnable et al. | 427/85 |
| 4,455,325 | 6/1984 | Razouk | 427/85 |
| 4,571,366 | 2/1986 | Thomas et al. | 428/446 |
| 4,603,468 | 8/1986 | Lam | 29/571 |
| 4,606,114 | 8/1986 | Kraus | 29/571 |
| 4,628,589 | 12/1986 | Sundaresan | 29/571 |
| 4,661,177 | 4/1987 | Powell | 148/189 |
| 4,835,113 | 5/1989 | Celler et al. | 437/37 |
| 4,837,179 | 6/1989 | Foster et al. | 437/44 |
| 4,891,331 | 1/1990 | Rapp | 437/164 |
| 4,910,160 | 3/1990 | Jennings et al. | 437/31 |
| 4,996,168 | 2/1991 | Ozaki et al. | 437/164 |
| 5,024,959 | 6/1991 | Pfiester | 437/34 |
| 5,047,357 | 9/1991 | Eklund | 437/31 |

FOREIGN PATENT DOCUMENTS

| | | | |
|---|---|---|---|
| 53-135263 | 11/1978 | Japan . | |
| 57-194525 | 11/1982 | Japan . | |
| 61-51912 | 3/1986 | Japan | 437/151 |
| 61-87322 | 5/1986 | Japan . | |
| 62-60220 | 3/1987 | Japan . | |
| 62-73711 | 4/1987 | Japan | 437/31 |
| 62-216322 | 9/1987 | Japan . | |
| 159858 | 3/1989 | Japan | 437/31 |
| 1179357 | 7/1989 | Japan | 437/31 |
| 254522 | 2/1990 | Japan | 437/31 |

OTHER PUBLICATIONS

Wolf et al. "Silicon processing for the VLSIx era" Lattice press, 1986, pp. 57 58.

Berkenblit et al. "Device fabrication using paint on diffusion sources" IBM *Tech. Dis. Bull vol. 14(6), Nov. 1971, p. 1709.

Primary Examiner—R. Bruce Breneman
Assistant Examiner—Ramamohan Rao Paladugu
Attorney, Agent, or Firm—Paul W. Martin

[57] ABSTRACT

A method for forming a bipolar transistor which employs a single drive-in step to form an emitter and a base. A layer of SOG containing a plurality of dopants is spun onto a collector, typically silicon. The dopants are driven into the collector to form the base and emitter. The method employs diffusion instead of implanting to form shallow and abrupt junctions without damage to the crystal lattice of the silicon.

15 Claims, 3 Drawing Sheets

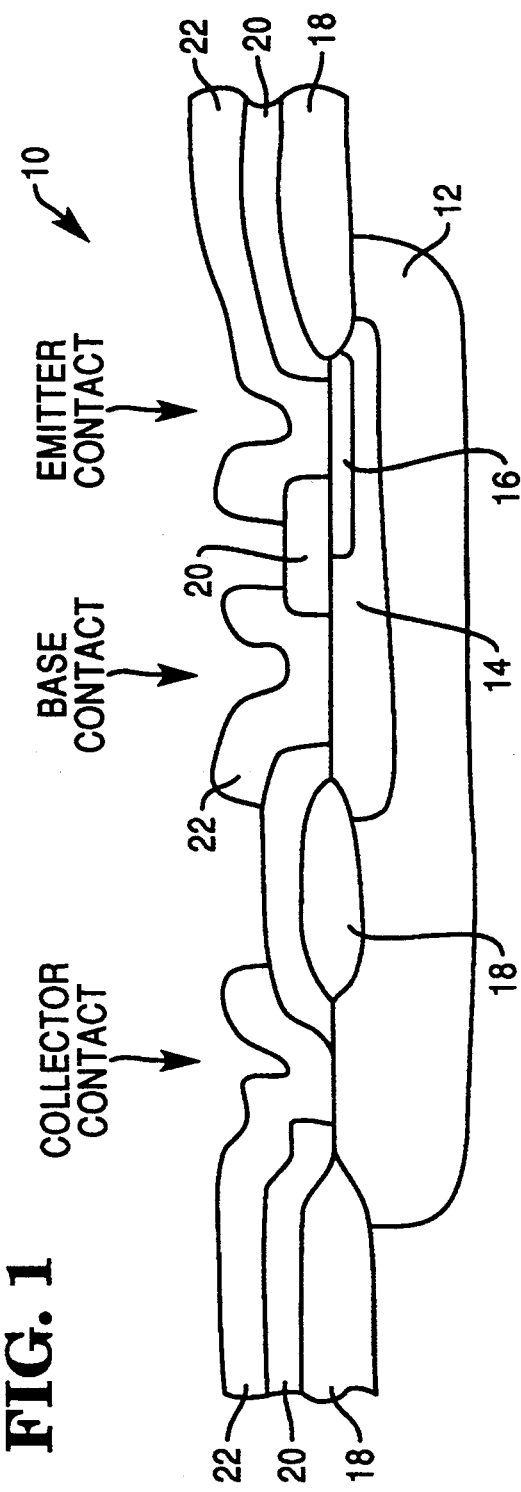
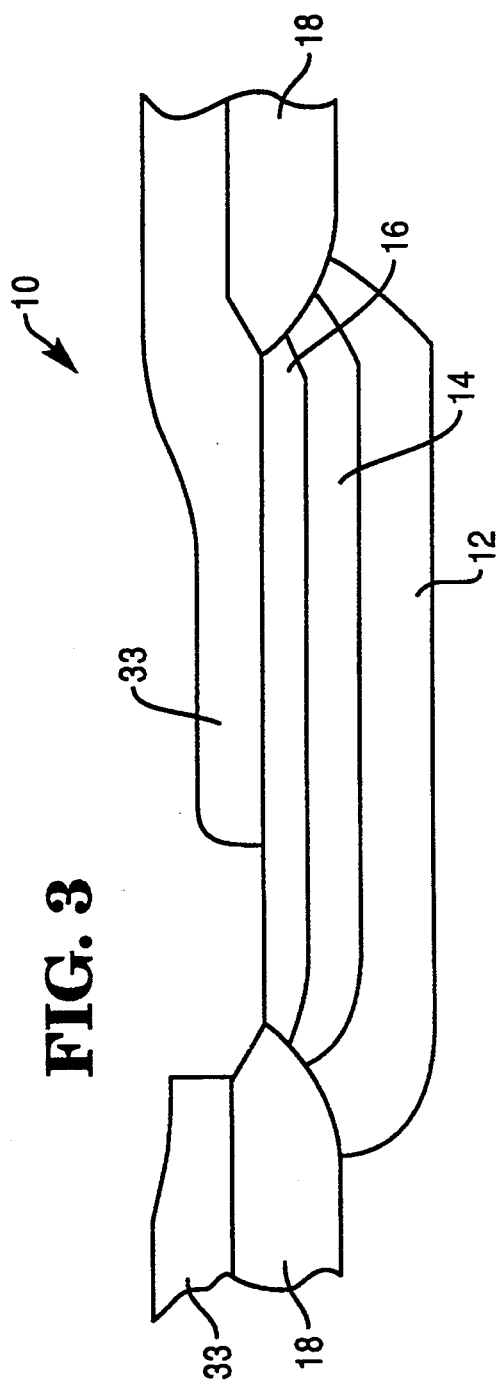

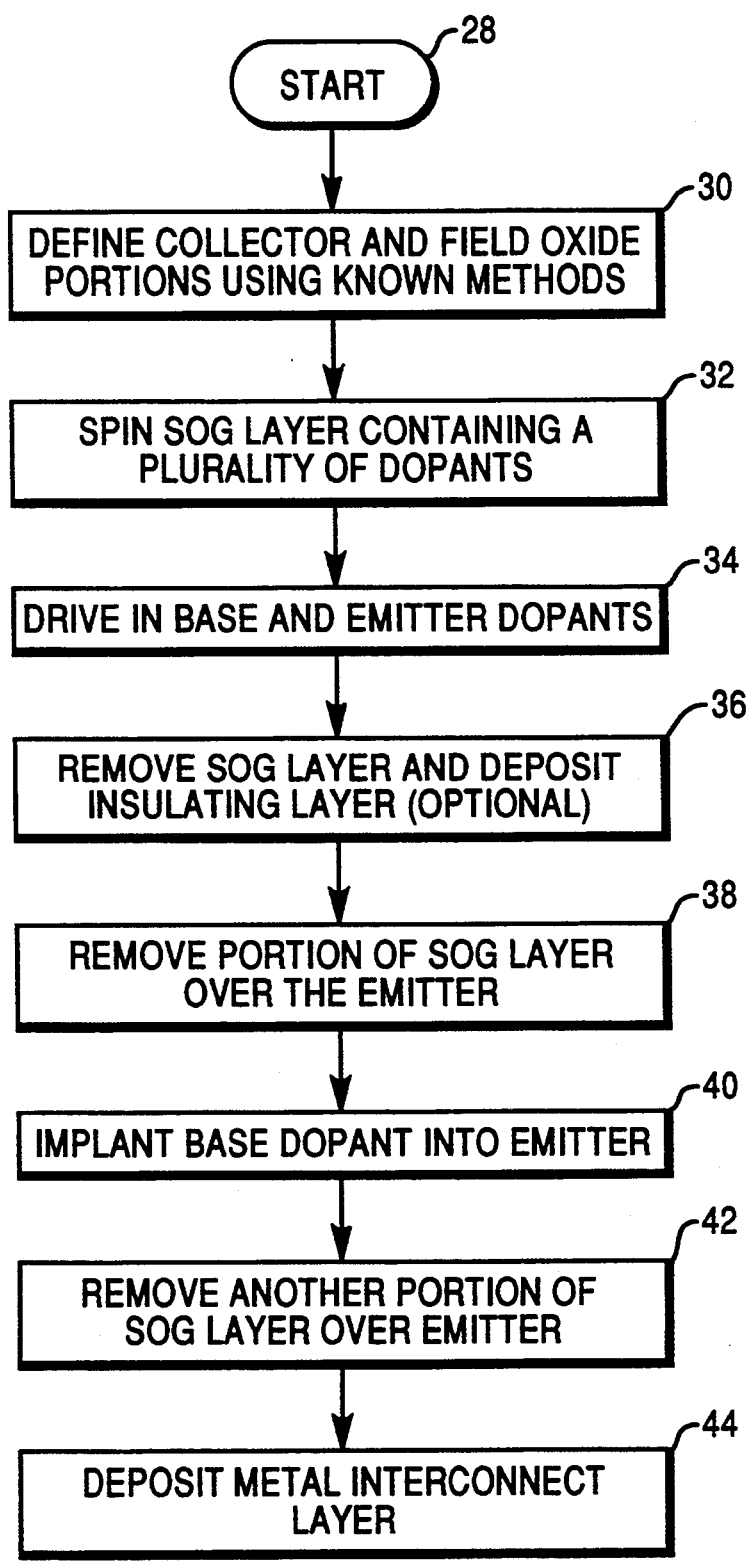

METHOD FOR FORMING A BIPOLAR TRANSISTOR USING DOPED SOG

CROSS-REFERENCE TO RELATED APPLICATIONS

The present invention is related to the following commonly assigned and co-pending U.S. applications, which have been filed concurrently with the present application:

"Shallow Junction SOG Process", invented by Allman et al., and having a Ser. No. 07/965,822, pending;

"Selective Sidewall Diffusion Process Using Doped SOG" invented by Allman et al., and having a Ser. No. 02/961,967, now U.S. Pat. No. 5,308,790;

"Method for Forming a Bipolar Emitter Using Doped SOG", invented by Allman et al., and having a Ser. No. 07/961,973, now pending; and "Global Planarization Using Doped SOG and Chemical Metal Polish", invented by Allman et al., and having a Ser. No. 07/965,309, now U.S. Pat. No. 5,312,512.

BACKGROUND OF THE INVENTION

The present invention relates to methods for producing integrated circuit devices and more specifically to a method for forming a bipolar transistor using doped spin on glass (SOG).

Known methods for forming bipolar transistors involve at least two mask, etch, and implant operations in which n-type and p-type impurities are implanted into a collector, typically made of silicon. The base is formed with the first mask, etch, and implant operation. The photoresist layer used during the masking operation is removed and a new photoresist layer is provided before the second implanting operation. The emitter is formed during the second mask, etch, and implant operation. In such a process, the implant energy has to be reduced to produce shallow junctions.

This method suffers from the disadvantage that implanting produces defects which lie in the space charge region of the junction. The implanted impurity is brought to rest by an inelastic collision with silicon atoms in the crystal lattice, which damages the crystal lattice structure by knocking silicon atoms out of place. The crystal lattice structure must be epitaxially regrown by a thermal anneal to activate the implanted impurities by incorporating them into the crystal lattice. For shallow junctions, a rapid thermal process (RTP) cycle is typically performed. The damage from implanting is not totally repairable without causing undesirable enhanced diffusion of the impurities which is inconsistent with shallow junction technology. Defect sites having energies in the middle of the band gap remain and produce a conduction path which ultimately causes a leakage current to flow.

Therefore, it would be desirable to provide a process for forming a bipolar transistor, which does not suffer from the disadvantages of known process steps.

SUMMARY OF THE INVENTION

In accordance with the teachings of the present invention, a method for forming a bipolar transistor using doped SOG is provided. The method employs a single drive-in step to form an emitter and a base. A layer of SOG containing a plurality of dopants is spun onto a collector, typically silicon. The dopants are driven into the collector to form the base and emitter. The method employs diffusion instead of implanting to form shallow and abrupt junctions without damage to the crystal lattice of the silicon.

It is accordingly an object of the present invention to provide a method for forming a bipolar transistor using doped SOG.

It is another object of the present invention to provide a method for forming a bipolar transistor using doped SOG which includes a single drive-in step to form the emitter and the base.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

FIG. 1 is a cross-sectional view of a bipolar transistor formed using the method of the present invention;

FIG. 2 is a flow diagram of the method of the present invention;

FIG. 3 is a cross-sectional view of the bipolar transistor of FIG. 1 at a point in its formation;

DETAILED DESCRIPTION OF THE PREFERRED EMBODIMENT

Figure 4:
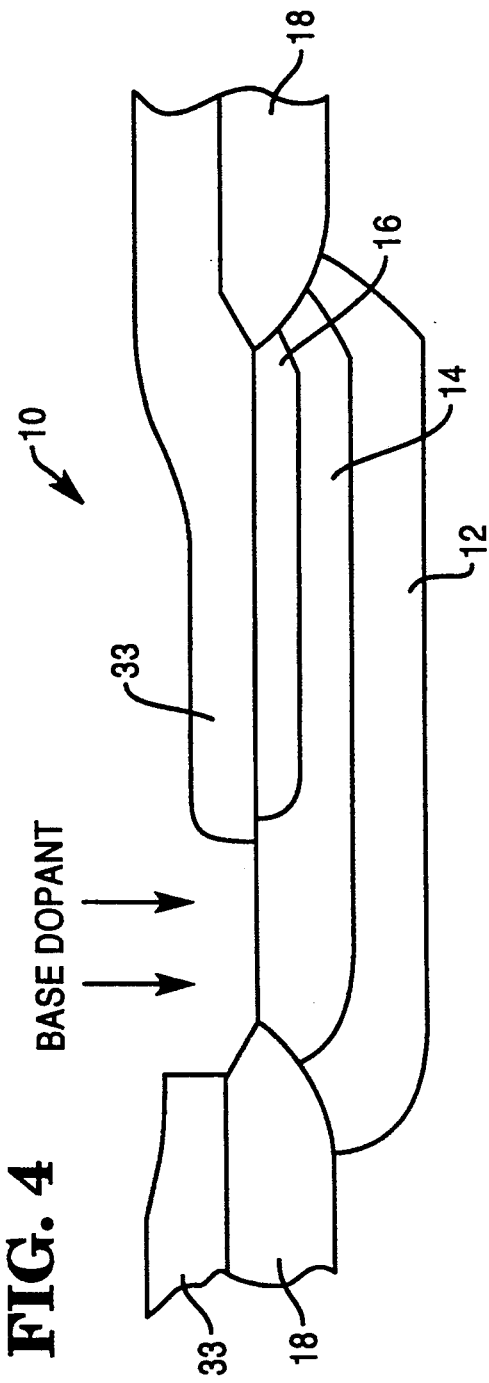
FIG. 4 is a cross-sectional view of the bipolar transistor of FIG. 1 at a point in its formation.

Referring now to FIG. 1, a bipolar transistor 10 manufactured using the method of the present invention is shown. Transistor 10 includes underlying collector layer 12, base layer 14, emitter layer 16, field oxide portions 18, insulating layer 20, and metal interconnect layer 22.

Turning now to FIG. 2, the method of the present invention begins at START 28. In block 30, collector 12 and field oxide portions 18 are defined using known BiCMOS or bipolar process steps.

In block 32, layer 33 of doped SOG is spun onto collector 12 at a thickness anywhere between about 100 angstroms to 15 microns, with a preferred thickness of about 3000 angstroms. Layer 12 preferably includes two dopants, such as boron and phosphorus. A base dopant is chosen which will diffuse faster than the emitter dopant at a predetermined temperature. Preferably, boron is used to form base 14 while phosphorous is used to form emitter 16. Other dopants may include arsenic, antimony, and gold. Arsenic may be used in place of phosphorus to provide more abrupt junctions. Gold may be combined with phosphorus to increase the generation or recombination rate of electrons, thus allowing device 10 to operate at higher frequencies.

There are two different ways of doping the SOG. A first way is to put the dopant into the SOG polymer. A second way is to leave the dopant as a free-floating particle suspended outside the polymer. When boron and phosphorus are part of the polymer, concentrations of about 4% boron and about 1% phosphorus have worked well.

In block 34, the base and emitter dopants are both driven into collector 12 using a single rapid thermal process (RTP) cycle. The width of base 14 may be varied by varying the heating time or temperature. Relatively speaking, smaller base widths can be produced by either lowering the temperature or decreasing the heating time. During the RTP cycle, layer 33 is changed to silicon dioxide, which is an insulator.

In block 36, layer 33 may be left in place or removed by a plasma or wet etch process in favor of a better insulator. Undoped silicon oxides are preferred.

In block 38, a portion of layer 20 over emitter 16 is removed by a mask and etch operation (FIG. 3).

In block 40, boron is implanted into the exposed portion of emitter 16. This step is performed to provide a contact point for base 14 (FIG. 4).

Figure 5:
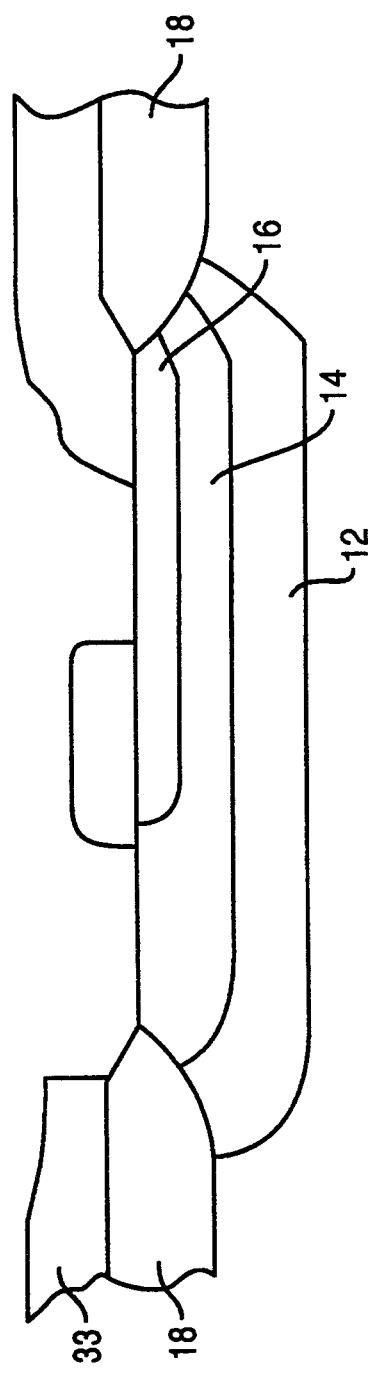
FIG. 5 is a cross-sectional view of the bipolar transistor of FIG. 1 at a point in its formation.

In block 42, another portion of layer 20 is removed to provide a contact point for emitter 16. A mask and etch operation is performed (FIG. 5).

In block 44, metal interconnect layer 22 is deposited over layer 20.

Although the present invention has been described with particular reference to certain preferred embodiments thereof, variations and modifications of the present invention can be effected within the spirit and scope of the following claims.

What is claimed is:

1. A method for forming a semiconductor device comprising the steps of:
   spinning a layer of SOG containing a plurality of dopants over a substrate; and
   driving the dopants into the substrate at the same time, including the substep of performing an RTP cycle.

2. The method as recited in claim 1, wherein one of the dopants comprises boron.

3. The method as recited in claim 1, wherein one of the dopants comprises phosphorus.

4. The method as recited in claim 1, wherein one of the dopants comprises arsenic.

5. The method as recited in claim 1, wherein one of the dopants comprises gold.

6. The method as recited in claim 1, wherein the substrate includes a collector, and wherein a first dopant forms a base and a second dopant forms an emitter.

7. The method as recited in claim 1, wherein the RTP cycle is performed at a temperature of about 1050 degrees Celsius and a time of about 60 seconds.

8. The method as recited in claim 1, wherein the RTP cycle is performed at a temperature of about 1100 degrees Celsius and a time of about 40 seconds.

9. The method as recited in claim 1, wherein the step of spinning comprises the substep of spinning the SOG layer to a thickness of about 5000 angstroms.

10. The method as recited in claim 1, further comprising the steps of:
    removing the SOG layer; and
    depositing an insulating layer.

11. The method as recited in claim 10, wherein the insulating layer comprises an undoped silicon oxide.

12. The method as recited in claim 6, further comprising the steps of:
    masking an area of the SOG layer;
    etching away the SOG layer outside the area; and
    implanting the emitter with the first dopant to provide a contact point for the base.

13. The method as recited in claim 12, further comprising the steps of:
    masking a second area of the SOG layer;
    etching away the SOG layer outside the a second area; and
    depositing a metal interconnect layer over the SOG layer and in contact with the base and the emitter.

14. A method for forming a semiconductor device comprising the steps of:
    spinning a layer of SOG containing a plurality of dopants over a collector;
    driving the first and second dopants into the substrate at the same time to form a base and an emitter, including the substep of performing an RTP cycle;
    masking a area of the SOG layer;
    etching away the SOG layer outside the area;
    implanting the emitter with the first dopant to provide a contact point for the base;
    masking a second area of the SOG layer;
    etching away the SOG layer outside the a second area; and
    depositing a metal interconnect layer over the SOG layer and in contact with the base and the emitter.

15. A method for forming a semiconductor device comprising the steps of:
    spinning a layer of SOG containing a plurality of dopants over a collector;
    driving the first and second dopants into the substrate at the same time to form a base and an emitter, including the substep of performing an RTP cycle;
    removing the SOG layer;
    depositing an insulating layer;
    masking a area of the insulating layer;
    etching away the insulating layer outside the area;
    implanting the emitter with the first dopant to provide a contact point for the base;
    masking a second area of the insulating layer;
    etching away the insulating layer outside the a second area; and
    depositing a metal interconnect layer over the insulating layer and in contact with the base and the emitter.

* * * * *